US011491762B2

(12) United States Patent
Ahn et al.

(10) Patent No.: US 11,491,762 B2
(45) Date of Patent: *Nov. 8, 2022

(54) THERMALLY RELEASABLE ADHESIVE MEMBER AND DISPLAY APPARATUS INCLUDING THE SAME

(71) Applicants: Samsung Display Co., Ltd., Yongin-Si (KR); Myongji University Industry and Academia Cooperation Foundation, Yongin-si (KR)

(72) Inventors: Byungwook Ahn, Seoul (KR); Jongdeok Park, Seoul (KR); Jeongho Hwang, Cheonan-si (KR); Junhyup Lee, Seongnam-si (KR); Intae Son, Yongin-si (KR); Byungsun Lee, Yongin-si (KR)

(73) Assignees: SAMSUNG DISPLAY CO., LTD., Gyeonggi-Do (KR); MYONGJI UNIVERSITY INDUSTRY AND ACADEMIA COOPERATION FOUNDATION, Gyeonggi-Do (KR)

( * ) Notice: Subject to any disclaimer, the term of this patent is extended or adjusted under 35 U.S.C. 154(b) by 101 days.

This patent is subject to a terminal disclaimer.

(21) Appl. No.: 16/925,834

(22) Filed: Jul. 10, 2020

(65) Prior Publication Data
US 2020/0377764 A1    Dec. 3, 2020

Related U.S. Application Data

(62) Division of application No. 15/971,453, filed on May 4, 2018, now Pat. No. 10,745,592.

(30) Foreign Application Priority Data

Jun. 13, 2017 (KR) .................. 10-2017-0074333

(51) Int. Cl.
*B32B 7/12* (2006.01)
*B32B 27/06* (2006.01)
(Continued)

(52) U.S. Cl.
CPC ............... *B32B 7/12* (2013.01); *B32B 27/06* (2013.01); *B32B 5/16* (2013.01);
(Continued)

(58) Field of Classification Search
CPC .............. B32B 5/16; B32B 7/12; B32B 27/06
(Continued)

(56) References Cited

U.S. PATENT DOCUMENTS 6,488,803 B2   12/2002   Kiuchi et al.
7,029,550 B2    4/2006   Kiuchi et al.
(Continued)

FOREIGN PATENT DOCUMENTS

CN   1469914 A    1/2004
JP   2001293464 A   10/2001
(Continued)

OTHER PUBLICATIONS

Lee, et al. "A Simple Approach for the Preparation of Fluorescent Poly(methyl methacrylate)-Polyethyleneimine Nanoparticles Containing Biomolecular Curcumin" Journal of Nanoscience and Nanotechnology vol. 16, pp. 10874-10880, 2016
(Continued)

*Primary Examiner* — Betelhem Shewareged
(74) *Attorney, Agent, or Firm* — Cantor Colburn LLP

(57) ABSTRACT

A thermally releasable adhesive member includes a base resin and microcapsules dispersed in the base resin. At least one of the microcapsules includes a shell part which com-
(Continued)

US 11,491,762 B2

Page 2 prises a hydrophobic polymer material, and a hollow part which is defined by the shell part and contains an organic solvent.

15 Claims, 9 Drawing Sheets

(51) Int. Cl.

| | | |
|---|---|---|
| C09J 5/06 | (2006.01) | |
| H05K 5/00 | (2006.01) | |
| H05K 5/02 | (2006.01) | |
| C08J 3/12 | (2006.01) | |
| C08L 33/08 | (2006.01) | |
| B32B 5/16 | (2006.01) | |

(52) U.S. Cl.
CPC ......... *B32B 2264/203* (2020.08); *C08J 3/126* (2013.01); *C08L 33/08* (2013.01); *C08L 2207/53* (2013.01); *C09J 5/06* (2013.01); *G02F 2202/28* (2013.01); *H05K 5/0017* (2013.01); *H05K 5/0217* (2013.01)

(58) Field of Classification Search
USPC ........................................................ 428/200
See application file for complete search history.

(56) References Cited

U.S. PATENT DOCUMENTS

| | | | |
|---|---|---|---|
| 7,371,300 B2 | 5/2008 | Bain et al. | |
| 9,674,961 B2 | 6/2017 | Ahn | |
| 10,316,219 B2 * | 6/2019 | Ahn | ........................ B32B 7/12 |
| 2012/0034447 A1 | 2/2012 | Higuchi et al. | |
| 2013/0306231 A1 | 11/2013 | Tanaka et al. | |
| 2014/0306187 A1 * | 10/2014 | Kim | ........................ C08L 51/00 |
| | | | 257/40 |
| 2015/0144271 A1 | 5/2015 | Fujita | |
| 2016/0289516 A1 | 10/2016 | Makihata et al. | |
| 2018/0355216 A1 | 12/2018 | Ahn et al. | |
| 2020/0377764 A1 * | 12/2020 | Ahn | ........................ C09J 7/10 |

FOREIGN PATENT DOCUMENTS

| | | |
|---|---|---|
| JP | 2005029607 A | 2/2005 |
| JP | 3941448 B2 | 7/2007 |
| JP | 2007177210 A | 7/2007 |
| JP | 4886369 B2 | 2/2012 |
| JP | 5061890 B2 | 10/2012 |
| KR | 100473209 B1 | 3/2005 |
| KR | 100665421 B1 | 1/2007 |
| KR | 100696436 B1 | 3/2007 |
| KR | 100886677 B1 | 3/2009 |
| KR | 1020130112240 A | 10/2013 |
| KR | 1020140014824 A | 2/2014 |
| KR | 1020140123735 A | 10/2014 |
| KR | 1020150010646 A | 1/2015 |
| KR | 1020150062120 A | 6/2015 |
| KR | 1020160085759 A | 7/2016 |
| KR | 1020170051620 A | 5/2017 |
| KR | 1020180063959 A | 6/2018 |
| WO | 2010122942 A1 | 10/2010 |
| WO | 2014142192 A1 | 9/2014 |

OTHER PUBLICATIONS

Chinese Office Action (18H11161CN) for Application No. 201810606286.6 dated Mar. 17, 2021.

* cited by examiner

THERMALLY RELEASABLE ADHESIVE MEMBER AND DISPLAY APPARATUS INCLUDING THE SAME

This application claims priority to Korean Patent Application No. 10-2017-0074333, filed on Jun. 13, 2017, and all the benefits accruing therefrom under 35 U.S.C. § 119, the content of which in its entirety is herein incorporated by reference.

BACKGROUND

Exemplary embodiments of the invention relate to a thermally releasable adhesive member and a display apparatus including the same, and more particularly, to a thermally releasable adhesive member of which adhesive strength is decreased at a high temperature, and a display apparatus including the same.

Various display apparatuses which are used in a multimedia apparatus such as a television, a portable phone, a tablet computer, a navigation apparatus, and a game console are being developed. A display apparatus may be manufactured by combining a plurality of members with each other. In order to combine a plurality of members with each other, for example, a method of using an adhesive member is widely used. In particular, in a display apparatus, a method of combining a display panel with other members using an optically clear adhesive ("OCA") is used to improve visibility.

However, in case of requiring rework during manufacturing a display apparatus, an adhesive member used for combining members with each other is required to be detached. In this case, the adhesive member is required to be easily detached from the members of the display apparatus.

SUMMARY

Exemplary embodiments of the invention direct to a thermally releasable adhesive member of which adhesive force decreases by supplying heat, and a display apparatus of which reworkability is improved by using the thermally releasable adhesive member.

Exemplary embodiments of the invention are directed to a thermally releasable adhesive member which has relatively excellent optical properties of high optical transmittance and a low haze value, and a display apparatus which has relatively good display quality and of which reworkability is improved by including the thermally releasable adhesive member.

According to an exemplary embodiment, a thermally releasable adhesive member includes a base resin and microcapsules dispersed in the base resin, where at least one of the microcapsules includes a shell part which includes a hydrophobic polymer material, and a hollow part which is defined by the shell part and contains an organic solvent.

In an exemplary embodiment, a particle size of the at least one of the microcapsules may be from about 50 nanometers (nm) to about 500 nm.

In an exemplary embodiment, the hydrophobic polymer material may have solubility in water of about 1.0 or less at room temperature.

In an exemplary embodiment, the hydrophobic polymer material may include any one of polymethylmethacrylate, polymethylacrylate, polystyrene, polyvinyl acetate, polyvinyl benzoate, polyacrylonitrile, and polymethacrylonitrile, or a copolymer formed of or including a combination thereof.

In an exemplary embodiment, the hydrophobic polymer material may include a copolymer of polyacrylonitrile and polymethylmethacrylate.

In an exemplary embodiment, a vaporization temperature of the organic solvent may be from about 50° C. to about 150° C.

In an exemplary embodiment, the organic solvent may have solubility in water of about 1.0 or less at room temperature.

In an exemplary embodiment, the organic solvent may include at least one of methylcyclohexane, cyclohexane, cyclopentane, isooctane, tert-butylacetate, heptene, and heptane.

In an exemplary embodiment, at least one of the microcapsules may have a first volume at room temperature and a second volume greater than the first volume at the vaporization temperature or higher.

In an exemplary embodiment, the thermally releasable adhesive member may have a first adhesive force at room temperature and a second adhesive force at the vaporization temperature, and the second adhesive force may be equal to or less than 90% of the first adhesive force.

In an exemplary embodiment, the thermally releasable adhesive member may have a transmittance of about 90% or more in a wavelength region of about 400 nm to about 800 nm.

In an exemplary embodiment, a haze value of the thermally releasable adhesive member may be about 0.1% or less.

In an exemplary embodiment, an amount ratio of the microcapsules dispersed in the base resin may be from about 0.05 weight percentages (wt %) to about 40 wt % of a total amount of the base resin and the microcapsules.

In an exemplary embodiment, the thermally releasable adhesive member may be a double-sided adhesive sheet which includes a first side and a second side opposite to the first side, and a dispersion density of the microcapsules may decrease from the first side to the second side.

In an exemplary embodiment, the thermally releasable adhesive member may include a first adhesive part in which the microcapsules are dispersed with a first density, a second adhesive part in which the microcapsules are dispersed with a second density, and a third adhesive part disposed between the first adhesive part and the second adhesive part, where microcapsules in the third adhesive part are dispersed with a third density, and the third density may be smaller than or equal to a lower density of the first density and the second density.

In an exemplary embodiment, the base resin may include at least one of an acrylate-based resin, a silicone-based resin, a urethane-based resin, an epoxy-based resin, a rubber-based resin, and a polyester-based resin.

According to an exemplary embodiment, a thermally releasable adhesive member includes an optically clear base resin, and microcapsules, where at least one of the microcapsules includes a hydrophobic shell part, a hollow part which is defined by the hydrophobic shell part, and an organic solvent contained in the hollow part.

In an exemplary embodiment, the optically clear base resin may include an acrylate-based adhesive resin, and the hydrophobic shell part may include an acrylate-based polymer.

According to an exemplary embodiment, a display apparatus includes a display panel, a window member disposed on the display panel, and a thermally releasable adhesive member disposed between the display panel and the window member, where the thermally releasable adhesive member includes a base resin and microcapsules dispersed in the base resin, and where at least one of the microcapsules includes a shell part which includes a hydrophobic polymer material, and a hollow part which is defined by the shell part and contains an organic solvent.

In an exemplary embodiment, the display apparatus may further include an optically clear adhesive member which includes the base resin without the microcapsules, where the optically clear adhesive member may be disposed between the display panel and the thermally releasable adhesive member, or between the window member and the thermally releasable adhesive member.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
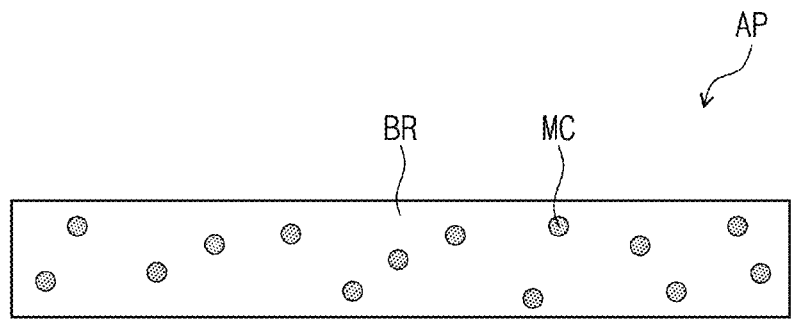
FIG. 1 is a cross-sectional view of an exemplary embodiment of a thermally releasable adhesive member.

The inventive concept may be embodied in different forms and may have various modifications, and exemplary embodiments of the inventive concept will be described below in more detail with reference to the accompanying drawings. The inventive concept, however, should not be construed as limited to the exemplary embodiments set forth herein. Rather, these exemplary embodiments should be understood to include modifications, equivalents, or substitutes within the spirit and scope of the inventive concept.

In the drawings, like reference numerals refer to like elements throughout. The dimensions of structures are exaggerated for clarity of illustration. It will be understood that, although the terms first, second, etc. may be used herein to describe various elements, these elements should not be limited by these terms. These terms are only used to distinguish one element from another element. Thus, a first element could be termed a second element without departing from the teachings of the present invention. Similarly, a second element could be termed a first element. As used herein, the singular forms are intended to include the plural forms as well, unless the context clearly indicates otherwise.

It will be further understood that the terms "comprises" and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof. It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein. The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items.

In the present disclosure, when a layer, a film, a region, a plate, etc. is referred to as being "on" or "above" another part, it can be "directly on" the other part, or intervening layers may also be present. On the contrary, it will be understood that when a layer, a film, a region, a plate, etc. is referred to as being "under" or "beneath" another part, it can be "directly under", and one or more intervening layers may also be present. In addition, it will also be understood that when a plate is referred to as being disposed "on" another part, it can be disposed above or beneath another part. "About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

In the exemplary embodiments, directions indicated by first to third directions DR1, DR2 and DR3 have relative concept, and may be changed to other directions.

Hereinafter, a thermally releasable adhesive member of an exemplary embodiment of the inventive concept and a display apparatus including the same will be explained in detail with reference to the drawings.

Figure 2:
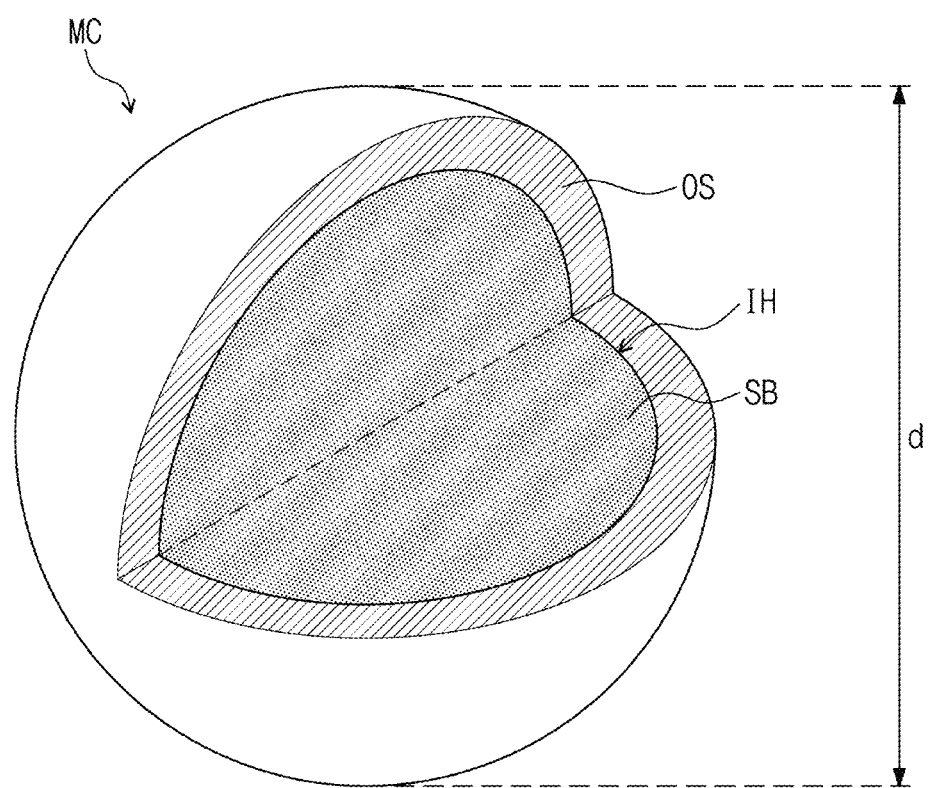
FIG. 2 is a diagram schematically illustrating an exemplary embodiment of a microcapsule included in a thermally releasable adhesive member.

FIG. 1 is a cross-sectional view of an exemplary embodiment of a thermally releasable adhesive member AP. FIG. 2 illustrates an exemplary embodiment of a microcapsule MC included in the thermally releasable adhesive member of FIG. 1.

Referring to FIG. 1, a thermally releasable adhesive member AP of an exemplary embodiment includes a base resin BR, and microcapsules MC dispersed and disposed in the base resin BR. The microcapsule MC includes a shell part OS, and a hollow part IH which is defined by the shell part OS. In the hollow part IH, an organic solvent SB is included.

In an exemplary embodiment, the base resin BR may include at least one of an acrylate-based resin, a silicone-based resin, a urethane-based resin, an epoxy-based resin, a rubber-based resin, and a polyester-based resin. For example, the base resin BR may be an adhesive resin including one or more of an acrylate-based resin, a silicone-based resin, a urethane-based resin, an epoxy-based resin, a rubber-based resin, and a polyester-based resin.

Particularly, the base resin BR may include one of 2-ethylhexyl acrylate, butyl acrylate, vinyl acetate, methyl methacrylate, ethyl acrylate, methyl acrylate, benzyl acrylate, phenoxyethyl acrylate, acrylic acid, hydroxyethyl methacrylate, glycidyl methacrylate, and acetoacetoxyethyl methacrylate, or a combination thereof. In addition, in the thermally releasable adhesive member AP according to the invention, materials included in the base resin BR are not limited to the suggested compounds but may further include other known adhesive resins.

The base resin BR may have a polymerized type of the acrylate-based resin. In an exemplary embodiment, for example, the base resin BR may be an adhesive member of a polymerized type of at least one of 2-ethylhexyl acrylate, butyl acrylate, vinyl acetate, methyl methacrylate, ethyl acrylate, methyl acrylate, benzyl acrylate, phenoxyethyl acrylate, acrylic acid, hydroxyethyl methacrylate, glycidyl methacrylate, and acetoacetoxyethyl methacrylate.

The base resin BR may be optically clear. The base resin BR may have a transmittance of about 90% or more in a visible light wavelength region. In an exemplary embodiment, for example, the base resin BR may have a transmittance of about 90% or more in a wavelength region of about 400 nm to about 800 nm. More particularly, the base resin BR may have a transmittance of about 95% or more in a wavelength region of about 400 nm to about 800 nm.

The base resin BR may be a liquid type including an acrylate-based resin monomer, or a solid type obtained by polymerizing or curing an acrylate-based resin monomer.

The thermally releasable adhesive member AP of the exemplary embodiment includes microcapsules MC. The microcapsules MC are dispersed in the base resin BR. The microcapsules MC may be randomly distributed in the base resin BR.

FIG. 2 is a diagram schematically illustrating an exemplary embodiment of the shape of a microcapsule MC included in a thermally releasable adhesive member. Referring to FIG. 2, the microcapsule MC included in the thermally releasable adhesive member AP according to the invention may have a sphere shape including a shell part OS and a hollow part IH which is defined by the shell part OS. That is, the microcapsule MC may have a hollow sphere shape having the hollow part IH therein. The hollow part IH includes an organic solvent SB. That is, the organic solvent SB may be collected in the hollow part IH. For example, in an exemplary embodiment, the hollow part IH of the microcapsule MC may be filled with the organic solvent SB, and the shell part OS may have a shape to wrap the organic solvent SB.

Even though FIG. 2 illustrates the microcapsule MC having a sphere shape, the microcapsule MC may have an ellipsoid shape. For example, the cross-sectional shape of the microcapsule MC may have a circular or ellipsoidal shape. However, the inventive concept is not limited thereto, and in another exemplary embodiment, the microcapsule MC may include the shell part OS wrapping the organic solvent SB and have an amorphous shape.

In the microcapsule MC, the shell part OS may be a hydrophobic shell part. That is, the shell part OS may be formed of or include a hydrophobic polymer material. In particular, the shell part OS may be formed of or include a hydrophobic acrylate-based polymer material.

The shell part OS may be formed of or include one kind of an acrylate-based polymer material, or an acrylate-based copolymer material formed or including at least two kinds of polymerization units.

In particular, the shell part OS may be formed of or include at least one polymer material among poly(methyl methacrylate), poly(methyl acrylate), polystyrene, poly(vinyl acetate), poly(vinyl benzoate), poly(acrylonitrile), and poly(methacrylonitrile), or may be formed of or include a copolymer including at least two polymer materials among poly(methyl methacrylate), poly(methyl acrylate), polystyrene, poly(vinyl acetate), poly(vinyl benzoate), poly(acrylonitrile), and poly(methacrylonitrile).

In an exemplary embodiment, for example, the shell part OS may be formed of or include polymethylmethacrylate ("PMMA"). In addition, the shell part OS may be formed of or include a copolymer of polyacrylonitrile ("PAN") and PMMA. For example, the copolymer of PAN and PMMA may be a graft copolymer.

The polymer material of a hydrophobic copolymer may include a polymerization unit having gas barrier properties. Particularly, the shell part OS may be formed of or include a copolymer including PAN having gas barrier properties as a polymerization unit. In an exemplary embodiment, for example, the polymer material of a hydrophobic copolymer may include polybenzimidazole or polyethyleneterephthalate, which has gas barrier properties as a polymerization unit.

In an exemplary embodiment, the shell part OS of the microcapsule MC may further include a cross-linking agent. In an exemplary embodiment, the cross-linking agent may be ethylene glycol dimethylacrylate, divinylbenzene, trimethylolpropane trimethacrylate, or pentaerythritol triacrylate.

That is, the shell part OS may further include at least one cross-linking agent in addition to an acrylate-based polymer or an acrylate-based copolymer.

In an exemplary embodiment, if the shell part OS is formed of or include a polymerization unit having gas barrier properties such as PAN, the effects of preventing leakage of the organic solvent SB from the shell part OS may be attained until the volume of the microcapsule MC is expanded at a certain amount at a temperature higher than the vaporization temperature of the organic solvent SB. That is, the effect of decreasing the adhesive force of the thermally releasable adhesive member AP may be enhanced by increasing the volume of the microcapsule MC at high temperature.

In an exemplary embodiment, the shell part OS of the microcapsule MC included in the thermally releasable adhesive member AP may be formed of or include a hydrophobic material. The shell part OS may include a hydrophobic polymer material, and the hydrophobic polymer may have solubility in water of about 1.0 or less at room temperature. In this case, the solubility of the hydrophobic polymer in water means the ratio of amount (grams: g) of the hydrophobic polymer dissolved in 100 g of water. The room temperature adapted for measuring the solubility may be, for example, about 25° C.

In an exemplary embodiment, the microcapsule MC having the shell part OS including the hydrophobic polymer material may have high compatibility with respect to the base resin BR. That is, the base resin BR and the shell part OS of the microcapsule MC are controlled to have similar degree of polarity, thereby increasing the amount ratio of the microcapsules MC with respect to the base resin BR in the thermally releasable adhesive member AP and increasing the compatibility of the microcapsule MC with respect to the base resin BR.

In an exemplary embodiment, the particle size of the microcapsule MC may be from about 50 nanometers (nm) to about 500 nm. Particularly, the particle size of the microcapsule MC may be from about 50 nm to about 200 nm. For example, as shown in FIG. 2, when the microcapsule MC has a spherical shape, the particle size may represent the diameter d of the microcapsule. The diameter d of the microcapsule MC may be from about 50 nm to about 500 nm. In another exemplary embodiment, if the microcapsule MC has an ellipsoidal shape, the particle size may represent the major axis diameter of an ellipsoid in the cross-section. If the microcapsule MC is amorphous, the particle size may represent the maximum width of the microcapsule MC.

In addition, at high temperature higher than or equal to the vaporization temperature of the organic solvent SB, the volume of the microcapsule MC included in the thermally releasable adhesive member AP may increase when compared to that before supplying heat. That is, comparing the first volume of the microcapsule MC at the room temperature, the second volume of the microcapsule MC at the vaporization temperature of the organic solvent SB may be greater.

The organic solvent SB included in the hollow part IH of the microcapsule MC may be vaporized at high temperature, thereby increasing the volume of the microcapsule MC and causing leaking out of the organic solvent SB from the microcapsule MC. Due to the volume increase of the microcapsule MC and the leakage of the organic solvent SB, the adhesive force of the thermally releasable adhesive member AP may decrease at temperature greater than or equal to the vaporization temperature of the organic solvent SB.

In a thermally releasable adhesive member AP of an exemplary embodiment, the microcapsules MC dispersed in the base resin BR may be plural, and the particle size of the plurality of the microcapsules MC may be the same or different from each other.

If the particle size of the microcapsule MC is greater than about 500 nm, the optical properties of a thermally releasable adhesive member AP may be deteriorated. A thermally releasable adhesive member AP including the microcapsules MC having a particle size greater than about 500 nm may have a decreased optical transmittance and an increased haze value. That is, the thermally releasable adhesive member AP including the microcapsules MC having a particle size greater than about 500 nm may have a decreased optical transmittance and an increased haze value, and may be inappropriate as an adhesive member for a display apparatus.

The smaller the particle size of the microcapsule MC is, the better the optical properties of the thermally releasable adhesive member AP are. That is, the smaller the particle size of the microcapsule MC is, the higher the transmittance of the thermally releasable adhesive member AP is, and the smaller the haze value is. However, if the particle size of the microcapsule MC is smaller than about 50 nm, the amount of the organic solvent SB included in the microcapsule MC may decrease significantly, and the thermally releasing properties of the thermally releasable adhesive member AP may be deteriorated.

In the microcapsule MC, the organic solvent SB may be included. That is, the microcapsule MC may include the organic solvent SB wrapped by the shell part OS.

The organic solvent SB included in the microcapsule MC may be a liquid phase material having optical anisotropy. The organic solvent SB may have a vaporization temperature of about 50° C. to about 150° C. That is, the organic solvent SB included in the thermally releasable adhesive member AP of an exemplary embodiment may be provided in a liquid status at the room temperature, and may be vaporized at a temperature from about 50° C. to about 150° C. Here, the vaporization temperature of the organic solvent SB may represent the boiling point of an organic solvent of a liquid status. In particular, the vaporization temperature of the organic solvent SB may be particularly from about 90° C. to about 110° C.

The organic solvent SB included in the thermally releasable adhesive member AP of an exemplary embodiment may be a hydrophobic solvent. Particularly, the organic solvent SB used in an exemplary embodiment may be a solvent having a solubility in water of about 1.0 or less at the room temperature. In this case, the solubility of the organic solvent in water represents a ratio by weight (grams: g) of an organic solvent dissolved in 100 g of water. The organic solvent SB having hydrophobicity may be disposed in the hollow part IH in the microcapsule MC. The room temperature adapted for measuring the solubility of the organic solvent may be, for example, about 25° C.

For example, in an exemplary embodiment, the organic solvent SB included in the hollow part IH of the microcapsule MC may include at least one of methylcyclohexane, cyclohexane, cyclopentane, isooctane, tert-butyl acetate, heptene, and heptane.

In case of supplying heat having a temperature higher than the vaporization temperature of the organic solvent SB included in the microcapsule MC to the thermally releasable adhesive member AP, the organic solvent SB included in the hollow part IH of the microcapsule MC may be leaked out to the exterior of the shell part OS, thereby decreasing the adhesive force of the thermally releasable adhesive member AP. The organic solvent SB vaporized and leaked out to the exterior of the microcapsule MC may move toward a surface of the thermally releasable adhesive member AP to decrease the adhesive force of the thermally releasable adhesive member AP at the surface contacting with an attached object.

In addition, in case of supplying heat having a temperature higher than the vaporization temperature of the organic solvent SB included in the microcapsule MC to the thermally releasable adhesive member AP, the volume of the microcapsule MC may increase due to the vaporized organic solvent SB. Due to the volume increase of the microcapsule MC, the total volume of the thermally releasable adhesive member AP may increase, and thus, the adhesive force of the thermally releasable adhesive member AP to an attached object may decrease.

If the adhesive force of the thermally releasable adhesive member AP at the room temperature is assumed as initial adhesive force, the ratio of the adhesive force of the thermally releasable adhesive member AP at the vaporization temperature of the organic solvent with respect to the initial adhesive force may be about 90% or less. That is, when the adhesive force of the thermally releasable adhesive member AP of an exemplary embodiment at the room temperature is regarded as the first adhesive force, and the adhesive force at the vaporization temperature of the organic solvent is regarded as the second adhesive force, a relation between the first and second adhesive forces may be expressed as an inequation of "second adhesive force ≤0.9X," where X is the first adhesive force. For example, the adhesive force of the thermally releasable adhesive member AP at the vaporization temperature of the organic solvent SB included in the microcapsule MC may decrease to the degree of about 10% to about 15% with respect to the adhesive force of the thermally releasable adhesive member AP at the room temperature.

Figure 3:
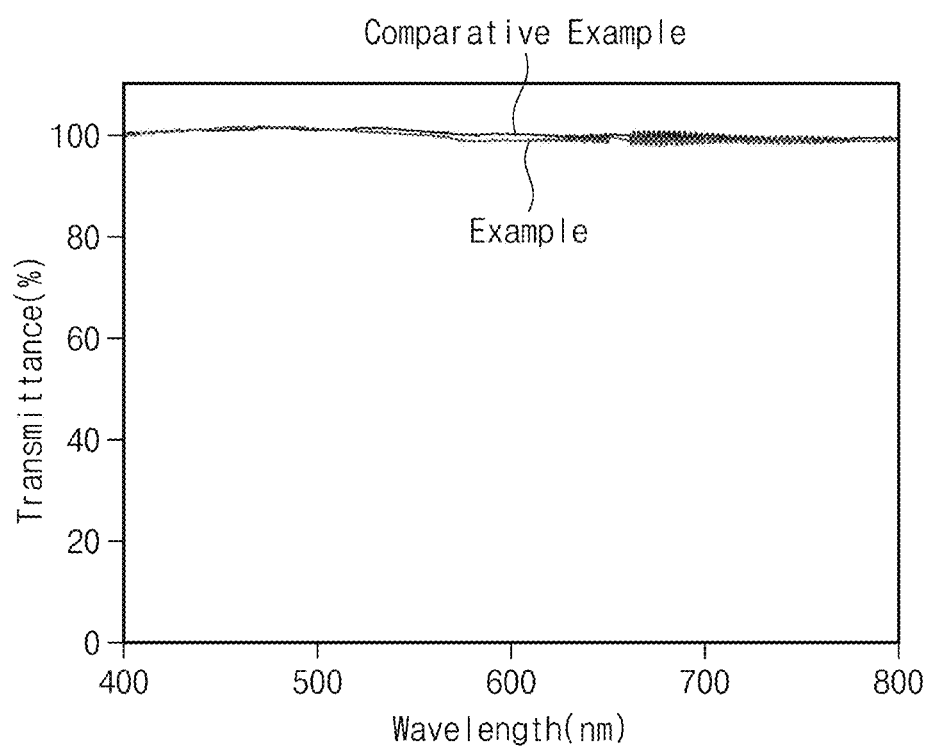
FIG. 3 is a graph illustrating optical transmittance (%) versus wavelength of the light (nm) in an exemplary embodiment of a thermally releasable adhesive member according to the invention.

The thermally releasable adhesive member AP of an exemplary embodiment may have transmittance of about 90% or more in a visible ray region. That is, the thermally releasable adhesive member AP of the exemplary embodiment may have transmittance of about 90% or more in a wavelength region of about 400 nm to about 800 nm. FIG. 3 is a graph illustrating optical transmittance (%) versus wavelength of the light (nm) in an exemplary embodiment of a thermally releasable adhesive member according to the invention. In FIG. 3, the comparative example corresponds to optical transmittance of an adhesive member composed of only a base resin without microcapsules. The example corresponds to optical transmittance of the thermally releasable adhesive member of an exemplary embodiment including a base resin and microcapsules dispersed in the base resin. The example corresponds to a case where about 1 weight percent (wt %) of microcapsules is included, that means that 1 g of microcapsules is included in a solution of the base resin and the microcapsules of the total amount of 100 g.

Referring to FIG. 3, it may be found that the thermally releasable adhesive member AP of an exemplary embodiment has high transmittance of about 95% or more in a wavelength region of about 400 nm to about 800 nm, which is a wavelength region of visible light.

In addition, the haze value of the thermally releasable adhesive member AP of an exemplary embodiment may be about 0.1% or less. The haze value may be measured using a haze meter. Since the thermally releasable adhesive member AP of an exemplary embodiment includes microcapsules MC having a nano scale particle size and has a high optical transmittance of about 90% or more and a low haze value of about 0.1% or less, the thermally releasable adhesive member AP may be used when optical transparency is required.

In the thermally releasable adhesive member AP of an exemplary embodiment, the absolute value of the refractive index difference between the base resin BR and the microcapsule MC may be about 0.1 or less. That is, the optical properties of the thermally releasable adhesive member AP of an exemplary embodiment may be improved by limiting the refractive index difference between the base resin BR and the microcapsule MC to about 0.1 or less.

In the thermally releasable adhesive member AP, the optical transmittance may be increased and the haze value may be decreased by controlling the absolute value of the refractive index difference of the base resin BR and the microcapsule MC to about 0.1 or less. In addition, in the thermally releasable adhesive member AP of an exemplary embodiment, the absolute value of the refractive index difference of the microcapsule MC and the organic solvent SB disposed in the shell part OS of the microcapsule may be also about 0.1 or less. That is, light distortion phenomenon due to the microcapsule MC in the thermally releasable adhesive member AP may be decreased by maintaining the refractive index difference of the base resin BR and the microcapsule MC to a small value of about 0.1 or less.

In the thermally releasable adhesive member AP of an exemplary embodiment, the microcapsule MC may be in included in an amount of about 0.05 wt % to about 40 wt %. That is, on the basis of 100 g of the total amount of the base resin BR and the microcapsules MC, the microcapsules may be included from about 0.05 g to about 40 g. If the amount included of the microcapsules is less than about 0.05 wt %, the thermally releasable adhesive member AP of an exemplary embodiment may have a small reduction width of adhesive force at a high temperature and may not be served as a thermally releasable adhesive member.

In addition, if the amount of the microcapsules MC is greater than about 40 wt %, the initial adhesive force of the thermally releasable adhesive member AP at the room temperature may decrease, and the haze value may increase, thereby deteriorating the optical properties of the thermally releasable adhesive member AP. In addition, due to the excessive increase of the amount of the microcapsules MC, the microcapsules MC may not be uniformly dispersed in the base resin BR and defects of phase separation may be generated.

Particularly, in the thermally releasable adhesive member AP of an exemplary embodiment, the microcapsules MC may be included in an amount of about 0.1 wt % to about 10 wt %.

In an exemplary embodiment, the thermally releasable adhesive member AP of an exemplary embodiment may further include a tackifying resin, a photoinitiator, or a cross-linking agent in addition to the base resin BR and the microcapsules MC.

Figure 4A:
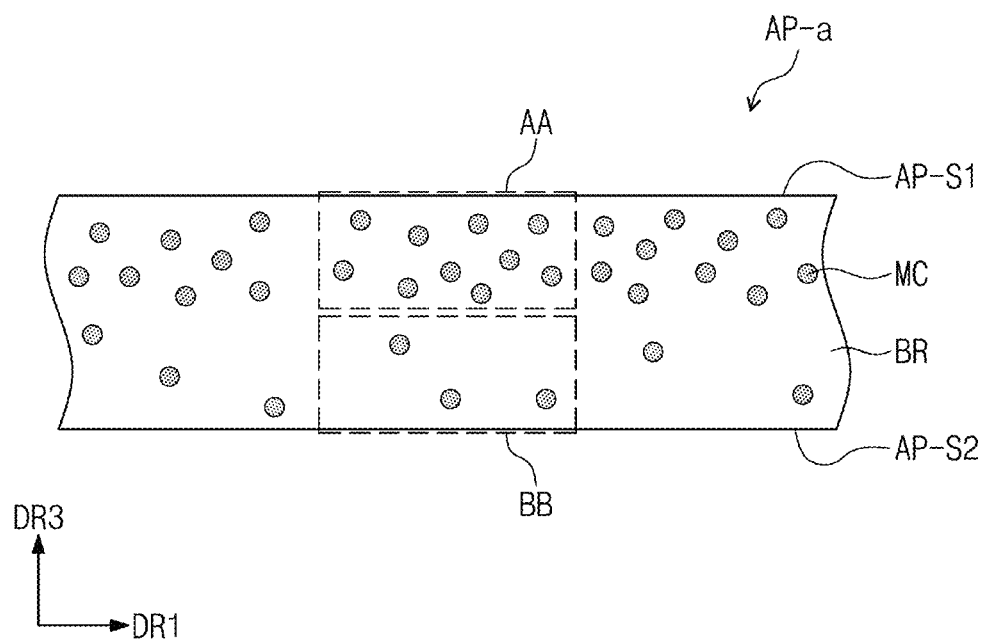
FIGS. 4A to 4C are cross-sectional views of exemplary embodiments of thermally releasable adhesive members.
Figure 4B:
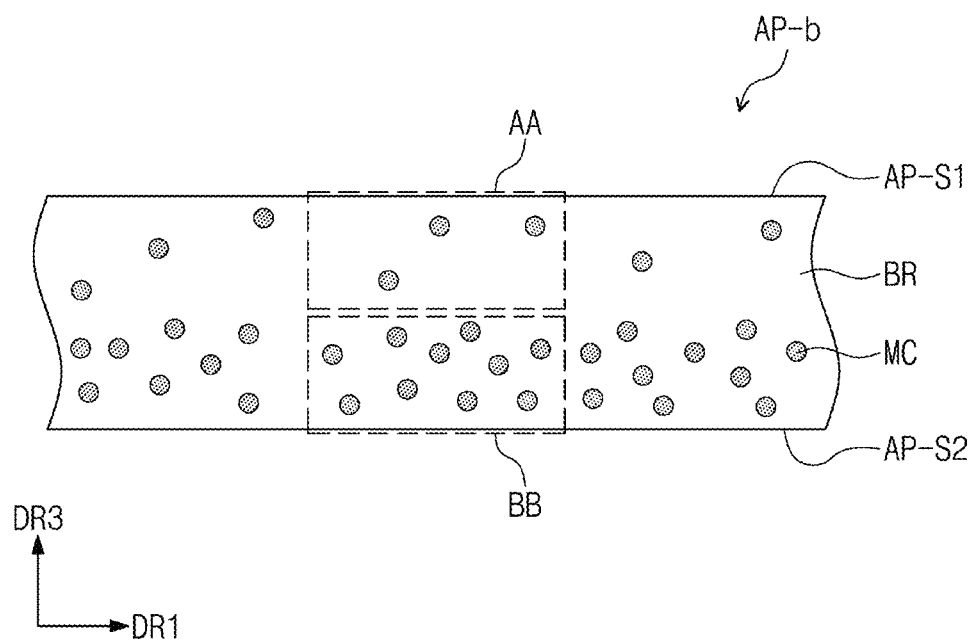
Figure 4C:
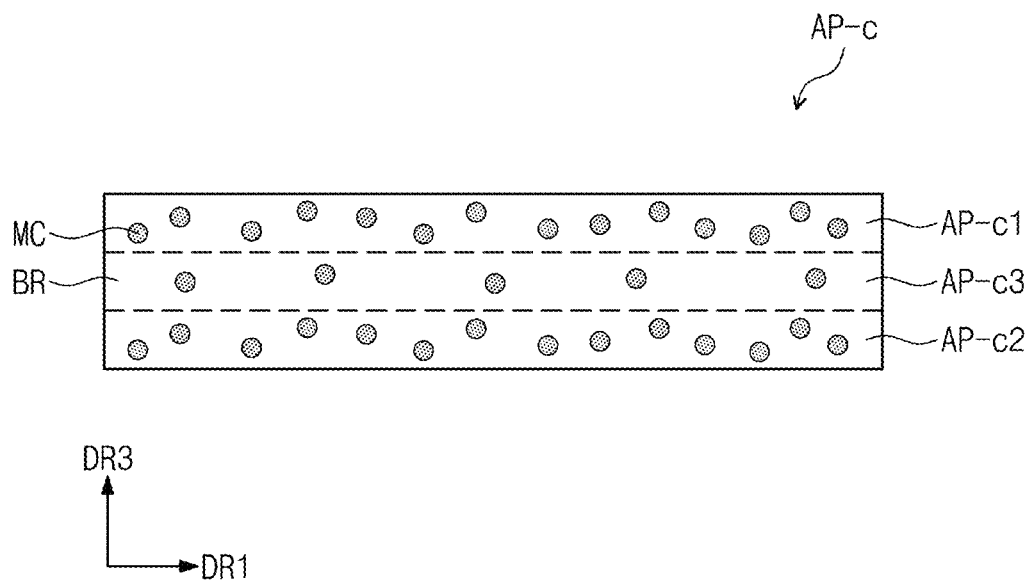

FIGS. 4A to 4C are enlarged cross-sectional views of exemplary embodiments of thermally releasable adhesive members. In FIGS. 4A to 4C, the thermally releasable adhesive members AP-a, AP-b and AP-c may be a double-sided adhesive sheet including adhesive two sides.

The thermally releasable adhesive members AP-a and AP-b illustrated in FIGS. 4A and 4B may include one side and the other side opposite to the one side, and the distribution density of the microcapsules MC may decrease from the one side to the other side.

In FIG. 4A, the one side may be a first side AP-S1, which is the top side of the thermally releasable adhesive member AP-a, and the other side may be a second side AP-S2, which is the bottom side of the thermally releasable adhesive member AP-a. Referring to FIG. 4A, the distribution density per unit area of the microcapsules MC distributed in a first area AA which is adjacent to the first side AP-S1 may be greater than the distribution density per unit area of the microcapsules MC distributed in a second area BB which is adjacent to the second side AP-S2. That is, in the thermally releasable adhesive member AP-a of an exemplary embodiment as shown in FIG. 4A, the distribution density of the microcapsules MC dispersed in the base resin BR may increase toward a third direction DR3 which is a thickness direction of the thermally releasable adhesive member AP-a and a direction from the second side AP-S2 to the first side AP-S1.

Differently, in the thermally releasable adhesive member AP-b of an exemplary embodiment as shown in FIG. 4B, the one side may be a second side AP-S2, which is the bottom side of the thermally releasable adhesive member AP-b, and the other side may be a first side AP-S1, which is the top side of the thermally releasable adhesive member AP-b. The distribution density per unit area of the microcapsules MC may decrease toward the third direction DR3 which is a thickness direction in the thermally releasable adhesive member AP-b and a direction from the second side AP-S2 to the first side AP-S1. That is, referring to FIG. 4B, the distribution density per unit area of the microcapsules MC which are distributed in the first area AA which is adjacent to the first side AP-S1 may be smaller than the distribution density per unit area of the microcapsules MC which are distributed in the second area BB which is adjacent to the second side AP-S2.

As shown in FIGS. 4A and 4B, in the cross-section of the thermally releasable adhesive members of exemplary embodiments, the distribution density of the microcapsules per unit area may not be uniform and may increase or decrease toward the top side from the bottom side.

In FIG. 4C, the thermally releasable adhesive member AP-c of an exemplary embodiment may include a first adhesive part AP-c1 in which microcapsules MC are dispersed with a first density, a second adhesive part AP-c2 in which microcapsules MC are dispersed with a second density, and a third adhesive part AP-c3 which is disposed between the first adhesive part AP-c1 and the second adhesive part AP-c2 and in which microcapsules MC are dispersed with a third density. In this case, the third density may be less than the first density and the second density or equal to the first density or the second density. That is, the distribution density of the microcapsules MC in the central part in the thermally releasable adhesive member AP-c may be smaller than the distribution density of the microcapsules MC at both opposing sides of the central part. For example, the first density and the second density may be the same, and the third density may be smaller than the first density and the second density. In another exemplary embodiment, the first density and the second density may be different from each other, and the third density may be smaller than the first density and the second density. In still another exemplary embodiment, the microcapsules MC may not be included in the third adhesive part AP-c3.

Referring to FIG. 4C, the microcapsules MC may be mainly disposed adjacent to the surface of the thermally releasable adhesive member AP-c in an exemplary embodiment. Particularly, the distribution density of the microcapsules MC may increase from the central part toward the top side or the bottom side in the thermally releasable adhesive member AP-c. That is, the detachment of the thermally releasable adhesive member AP-c under heating conditions at a high temperature may be readily performed by increasing the distribution density of the microcapsules MC toward the top side or the bottom side, where an object to be attached to the thermally releasable adhesive member AP-c is adjacently disposed.

Even though not shown in FIGS. 4A to 4C, the density of the microcapsules MC dispersed in the base resin BR in the thermally releasable adhesive member AP of an exemplary embodiment may be controlled diversely depending on the position and use of the thermally releasable adhesive member AP.

The thermally releasable adhesive members AP, AP-a, AP-b and AP-c of exemplary embodiments explained in FIGS. 1 to 4C may be provided as a double-sided adhesive sheet or an adhesive resin type. In an exemplary embodiment, for example, the thermally releasable adhesive members AP, AP-a, AP-b and AP-c of exemplary embodiments may be provided as a double-sided tape type in which exposed one side and the other side are bonded with objects to be attached, respectively. The thermally releasable adhesive member provided as a double-sided tape type may include partially uncured adhesive resin, and the uncured adhesive resin may be cured through an ultraviolet curing process.

In addition, the thermally releasable adhesive member of an exemplary embodiment may be provided as an adhesive resin type in a liquid status. The thermally releasable adhesive member provided in a liquid status may be transformed into a solid adhesive member type through an ultraviolet curing process or a thermal curing process. For example, the thermally releasable adhesive member provided as an adhesive resin in a liquid status may be directly provided on a side of an object to be attached and then may be solidified through an ultraviolet curing process to form an adhesive layer.

The thermally releasable adhesive member of an exemplary embodiment may have an optical transmittance of about 90% or more and a haze value of about 0.1% or less, and may be used as an optically clear adhesive ("OCA") or an optically clear resin ("OCR") in a display apparatus.

FIGS. 5A to 7 are exemplary embodiments of display apparatuses including the thermally releasable adhesive members. Referring to FIGS. 5A to 7, display apparatuses of exemplary embodiments will be explained. In the explanation on the display apparatuses of exemplary embodiments, overlapping parts with the above-description on the thermally releasable adhesive member of an exemplary embodiment will not be explained again.

Figure 5A:
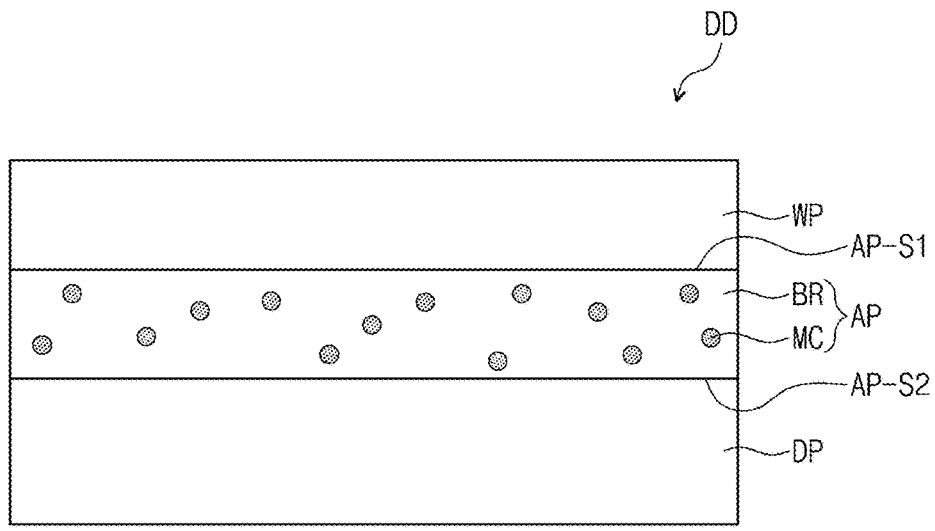
FIGS. 5A to 5C are cross-sectional views of exemplary embodiments of display apparatuses.

The display apparatus DD shown in FIG. 5A of an exemplary embodiment may include a display panel DP, a window member WP disposed on the display panel DP, and a thermally releasable adhesive member AP disposed between the display panel DP and the window member WP. The thermally releasable adhesive member AP may include a base resin BR and microcapsules MC dispersed in the base resin BR. The microcapsule MC may include a shell part OS and a hollow part IH which is defined by the shell part OS as illustrated in FIG. 2. In the hollow part IH, an organic solvent SB may be included. The microcapsule MC may have a particle size of about 50 nm to about 500 nm.

The same explanation on the thermally releasable adhesive member AP of FIGS. 1 to 4C may be applied to a thermally releasable adhesive member AP in the display apparatus DD of FIGS. 5A to 7.

The display panel DP may produce images and provide the produced images on the front side where the window member WP is disposed. The display panel DP may provide the produced images toward a third direction DR3. In an exemplary embodiment, for example, the display panel DP may be a liquid crystal display panel, an organic light emitting display panel, a plasma display panel, an electrophoretic display panel, a microelectromechanical system ("MEMS") display panel, or an electrowetting display panel.

The window member WP may be disposed on the display panel DP. The window member WP may cover the front side of the display panel DP and may be disposed to protect the display panel DP. For example, the area of the window member WP exposed to the front side of the display panel DP may be greater than the area of the top side of the display panel DP which faces the window member WP.

The window member WP may be a glass material. For example, a tempered glass substrate may be used as the window member WP. Alternatively, the window member WP may be formed of or include a flexible plastic material. In an exemplary embodiment, for example, the window member WP of a plastic material may be formed of or include polyimide, polyacrylate, PMMA, polycarbonate ("PC"), polyethylenenaphthalate ("PEN"), polyvinylidene chloride, polyvinylidene difluoride ("PVDF"), polystyrene, an ethylene-vinyl alcohol copolymer, or a combination thereof. However, the inventive concept is not limited thereto, and a common type known as the window member WP may be used without limitation.

Meanwhile, the window member WP may further include a functional layer (not shown). For example, the functional layer (not shown) may be a hard coating layer, a fingerprint-resistant coating layer, etc. However, the inventive concept is not limited thereto.

The thermally releasable adhesive member AP may be disposed between the display panel DP and the window member WP. The first side AP-S1 of the thermally releasable adhesive member AP may make contact with the window member WP, and the second side AP-S2 opposite to the first side AP-S1 may make contact with the display panel DP. The thermally releasable adhesive member AP may combine the display panel DP and the window member WP. The thermally releasable adhesive member AP may have a optical transmittance of about 90% or more and a haze value of about 0.1% or less so as to serve as an optically clear adhesive layer in the display apparatus DD.

In the display apparatus DD of an exemplary embodiment, the microcapsule MC of the thermally releasable adhesive member AP may include an organic solvent having a vaporization temperature of about 50° C. to about 150° C. The organic solvent may be a liquid status material having an optical isotropy. More particularly, the microcapsule MC may include an organic solvent having a vaporization temperature of about 90° C. to about 110° C.

The organic solvent is captured with a liquid status in the hollow part of the microcapsule MC at the room temperature, which corresponds to commonly used conditions of the display apparatus DD. If heat of a temperature higher than the vaporization temperature of the organic solvent is supplied to the display apparatus DD, the microcapsule MC may expand or the organic solvent in the microcapsule MC may be vaporized and leaked out from the microcapsule MC.

If the vaporization temperature of the organic solvent is less than about 50° C. in an exemplary embodiment, the organic solvent may be vaporized under commonly used conditions (e.g., the room temperature) of the display apparatus DD and may be leaked out from the microcapsule, thereby deteriorating the adhesive force of the thermally releasable adhesive member even under the commonly used conditions of the display apparatus DD. In addition, if the vaporization temperature of the organic solvent is higher than about 150° C. in an exemplary embodiment, heat of a temperature higher than about 150° C. is required to be supplied to detach the thermally releasable adhesive member. Accordingly, the members of the display panel DP or the window member WP are exposed to such a high temperature to detach the thermally releasable adhesive member, and the reliability of the display apparatus may be deteriorated.

Figure 5B:
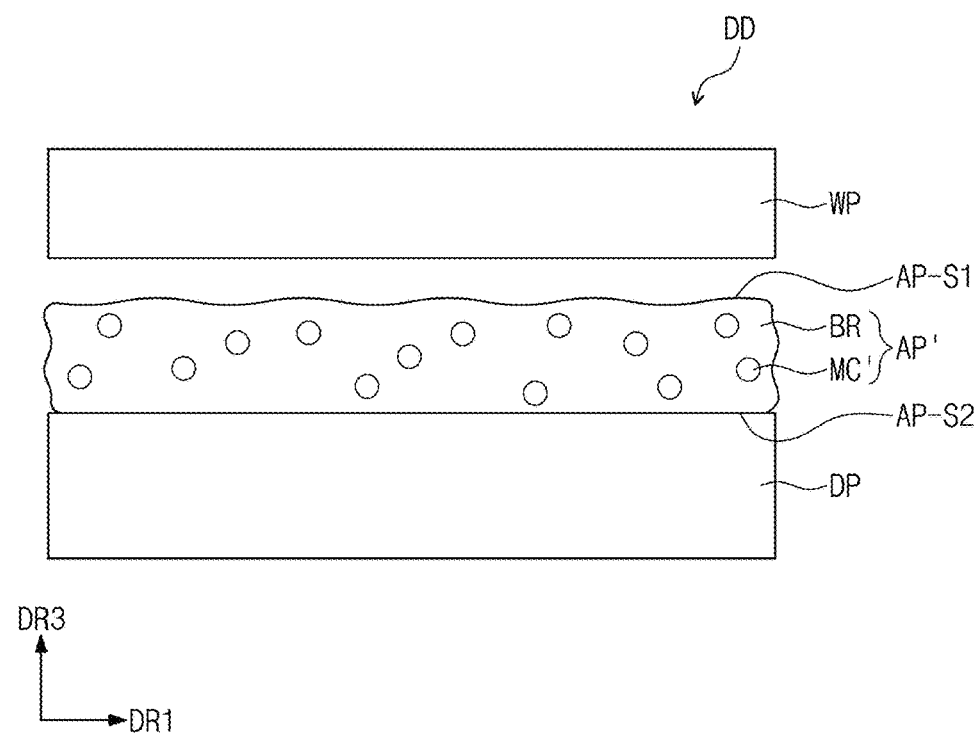
Figure 5C:
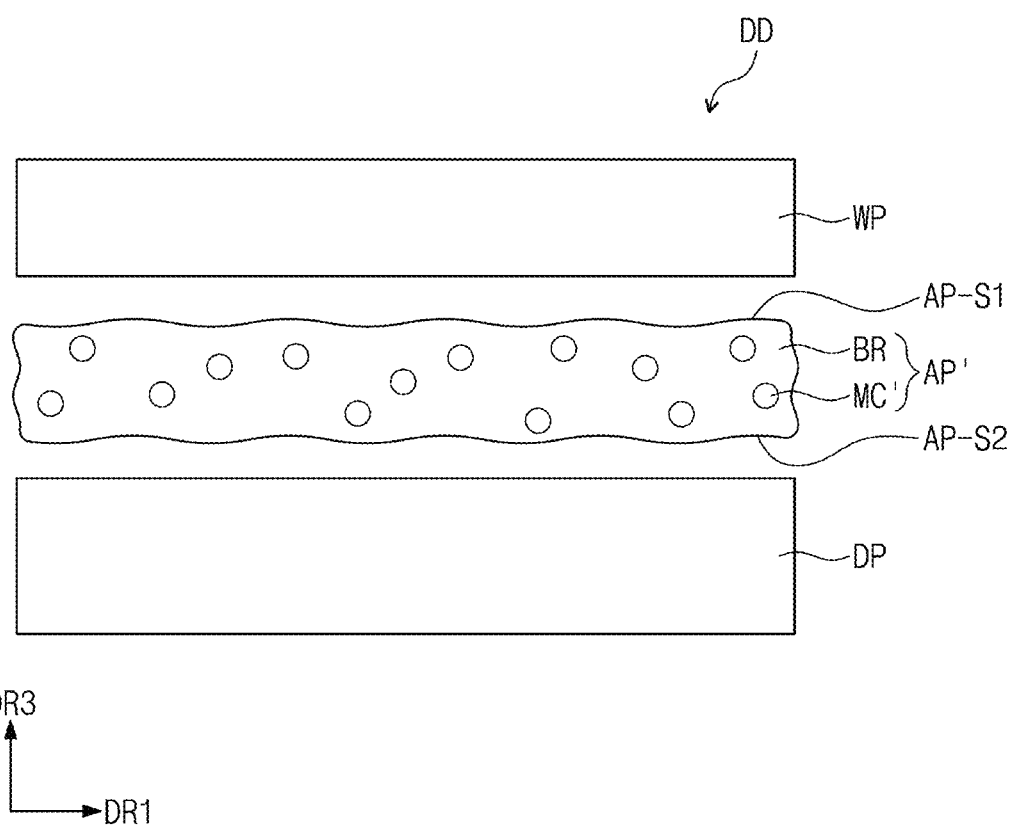

FIGS. 5B and 5C are diagrams illustrating cases when heat of a temperature higher than the vaporization temperature of an organic solvent is supplied to a display apparatus DD of an exemplary embodiment. Referring to FIG. 5B, the top side which is the first side AP-S1, adjacent to the window member WP, in the thermally releasable adhesive member AP' may be detached. In addition, the second side AP-S2 which is the bottom side, adjacent to the display panel DP, in the thermally releasable adhesive member AP' may not be detached.

Referring to FIG. 5C, both the top side which is the first side AP-S1 adjacent to the window member WP in the thermally releasable adhesive member AP', and the bottom side which is the second side AP-S2 adjacent to the display panel DP in the thermally releasable adhesive member AP', may be detached from the window member WP and the display panel DP which are attached objects. That is, adhesion properties may be controlled for the detachment from at least one side, considering the kind of the attached object which makes contact with the thermally releasable adhesive member AP' in an exemplary embodiment.

In cases illustrated in FIGS. 5B and 5C, the adhesive force of the thermally releasable adhesive member AP' to an attached object may be decreased if the organic solvent is vaporized and the volume of the microcapsule MC' increases. For example, the volume of the microcapsule MC' after supplying heat may be greater than the volume of the microcapsule MC (refer FIG. 5A) before supplying heat.

In addition, in cases illustrated in FIGS. 5B and 5C, the organic solvent may be leaked out from the microcapsules MC' and move from the thermally releasable adhesive member AP' toward one of the first side AP-S1 and the opposite second side AP-S2, or both sides. For example, in FIGS. 5B and 5C which illustrate states after supplying heat, the microcapsule MC' may not include the organic solvent or may include a small amount of the organic solvent in the hollow compared to the microcapsule MC of the thermally releasable adhesive member AP shown in FIG. 5A.

If the thermally releasable adhesive member AP-a illustrated in FIG. 4A is included in the display apparatus DD of an exemplary embodiment, the thermally releasable adhesive member AP-a may be detached from an object attached only at the first side AP-S1 in which the distribution density of the microcapsules MC is larger than that of the second side AP-S2. Alternatively, if the thermally releasable adhesive member AP-b illustrated in FIG. 4B is included in the display apparatus DD of an exemplary embodiment, the thermally releasable adhesive member AP-b may be detached from an object attached only at the second side AP-S2 in which the distribution density of the microcapsules MC is larger than that of the first side AP-S1.

Referring to FIGS. 5A to 5C, the thermally releasable adhesive member AP included in the display apparatus DD of an exemplary embodiment may include the first side AP-S1 which is adjacent to the window member WP and the second side AP-S2 which is opposite to the first side AP-S1 and adjacent to the display panel DP.

The adhesive force of the thermally releasable adhesive member AP to at least one side among the first side AP-S1 and the second side AP-S2 at a temperature higher than the vaporization temperature of the organic solvent included in the microcapsule MC may be about 90% or less of the adhesive force of the thermally releasable adhesive member AP to at least one side among the first side AP-S1 and the second side AP-S2 at the room temperature. That is, when the thermally releasable adhesive member has a first adhesive force with respect to at least one side among the first side AP-S1 and the second side AP-S2 at the room temperature and has a second adhesive force with respect to at least one side among the first side AP-S1 and the second side AP-S2 at the vaporization temperature, a relation between the first and second adhesive forces may be expressed as an inequation of "second adhesive force $\leq 0.9X$," where X is the first adhesive force.

For example, the adhesive force of the thermally releasable adhesive member AP at a temperature higher than the vaporization temperature of the organic solvent which is included in the microcapsule decreases compared to the adhesive force thereof at the room temperature. For example, the adhesive force of the thermally releasable adhesive member AP at a temperature higher than the vaporization temperature of the organic solvent may decrease to about 70% or less compared to the adhesive force at the room temperature. In addition, the adhesive force of the thermally releasable adhesive member AP after supplying heat of a temperature higher than the vaporization temperature of the organic solvent may decrease to about 10% to about 15% of the adhesive force at the room temperature.

The display apparatus DD of an exemplary embodiment includes the thermally releasable adhesive member AP of which adhesive force decreases at a high temperature, and the members attached during the manufacturing process of the display apparatus DD may be easily separated by supplying heat of about the vaporization temperature of the organic solvent. Accordingly, when the reassembly of the display apparatus DD is required, the thermally releasable adhesive member AP may be detached without damaging other members, and therefore the reworkability and productivity of the display apparatus DD may be improved.

Figure 6A:
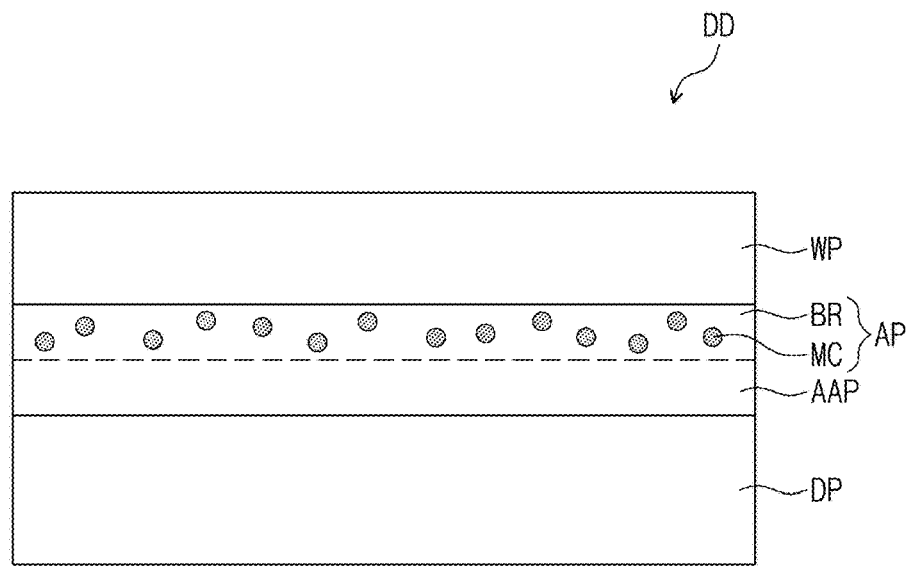
FIGS. 6A to 6B are cross-sectional views of another exemplary embodiment of display apparatuses.
Figure 6A:
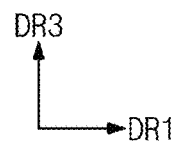
Figure 6B:
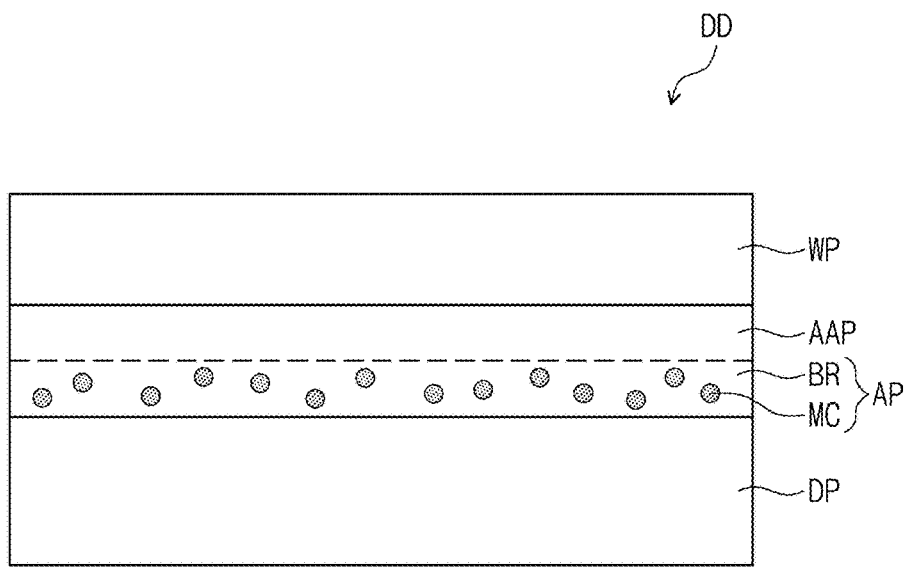
Figure 6B:
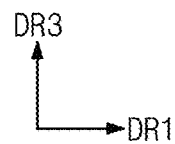

FIGS. 6A and 6B are cross-sectional views of another exemplary embodiment of a display apparatus DD. Referring to FIGS. 6A and 6B, a display apparatus DD of an exemplary embodiment may include a display panel DP, a window member WP disposed on the display panel DP, and a thermally releasable adhesive member AP disposed between the display panel DP and the window member WP. In addition, the display apparatus DD of an exemplary embodiment may further include an optically clear adhesive member AAP disposed on the thermally releasable adhesive member AP. The optically clear adhesive member AAP may be disposed between the display panel DP and the thermally releasable adhesive member AP, or between the window member WP and the thermally releasable adhesive member AP.

FIG. 6A illustrates a case where the optically clear adhesive member AAP is disposed between the display panel DP and the thermally releasable adhesive member AP. That is, the optically clear adhesive member AAP may be disposed adjacent to the display panel DP, and the thermally releasable adhesive member AP disposed on the optically clear adhesive member AAP may be disposed adjacent to the window member WP. In an exemplary embodiment of FIG. 6A, in the microcapsule MC included in the thermally releasable adhesive member AP, an organic solvent having a vaporization temperature of about 50° C. to about 150° C. may be included. Therefore, if heat of a temperature higher than the vaporization temperature of the organic solvent is supplied to the display apparatus DD, the interface between the window member WP and the thermally releasable adhesive member AP may be separated in an exemplary embodiment of FIG. 6A.

FIG. 6B illustrates a case where the optically clear adhesive member AAP is disposed between the window member WP and the thermally releasable adhesive member AP. That is, the thermally releasable adhesive member AP may be disposed adjacent to the display panel DP, and the optically clear adhesive member AAP disposed on the thermally releasable adhesive member AP may be disposed adjacent to the window member WP. In an exemplary embodiment of FIG. 6B, in the microcapsule MC included in the thermally releasable adhesive member AP, an organic solvent having a vaporization temperature of about 50° C. to about 150° C. may be included. Therefore, if heat of a temperature higher than the vaporization temperature of the organic solvent is supplied to the display apparatus DD, the interface between the display panel DP and the thermally releasable adhesive member AP may be separated in an exemplary embodiment of FIG. 6B.

The optically clear adhesive member AAP may include the base resin but not include the microcapsules compared to the thermally releasable adhesive member AP.

In an exemplary embodiment, the optically clear adhesive member AAP may include a base resin including one of 2-ethylhexyl acrylate, butyl acrylate, vinyl acetate, methyl methacrylate, ethyl acrylate, methyl acrylate, benzyl acrylate, phenoxyethyl acrylate, acrylic acid, hydroxyethyl methacrylate, glycidyl methacrylate and acetoacetoxyethyl methacrylate, or a combination thereof. The material included in the base resin in the optically clear adhesive member AAP according to the invention is not limited to the above-suggested compounds, but may further include known adhesive resins.

The optically clear adhesive member AAP and the thermally releasable adhesive member AP may be provided in one body. For example, the optically clear adhesive member AAP and the thermally releasable adhesive member AP may be provided as one adhesive layer in a combined state.

In another exemplary embodiment, the optically clear adhesive member AAP and the thermally releasable adhesive member AP may be respectively provided from separate processes. For example, the optically clear adhesive member AAP may be firstly provided to an object to be attached, and then, the thermally releasable adhesive member AP may be provided on the optically clear adhesive member AAP. In still another exemplary embodiment, the thermally releasable adhesive member AP may be firstly provided to an object to be attached, and then, the optically clear adhesive member AAP may be provided on the thermally releasable adhesive member AP. In still another exemplary embodiment, each of the optically clear adhesive member AAP and the thermally releasable adhesive member AP may be respectively provided to the opposite sides of an object to be attached, and then, the optically clear adhesive member AAP and the thermally releasable adhesive member AP may be combined with each other.

In the display apparatuses DD shown in FIGS. 6A and 6B, the thicknesses of the thermally releasable adhesive member AP and the optically clear adhesive member AAP may be the same or different. For example, the thickness of the thermally releasable adhesive member AP may be smaller than or equal to the thickness of the optically clear adhesive member AAP.

In the display apparatuses DD shown in FIGS. 6A and 6B, one layer of the thermally releasable adhesive member AP and one layer of the optically clear adhesive member AAP are laminated. However, the inventive concept is not limited thereto. For example, in a display apparatus of another exemplary embodiment, two thermally releasable adhesive members AP may be disposed at both sides of an optically clear adhesive member AAP.

Figure 7:
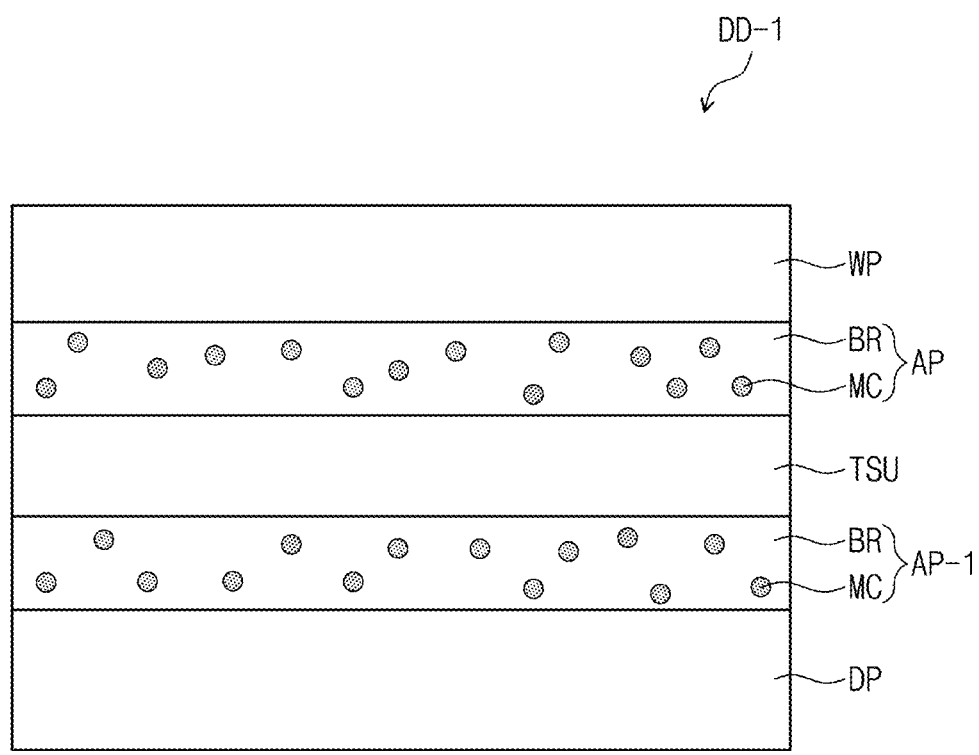
FIG. 7 is a cross-sectional view of still another exemplary embodiment of a display apparatus.

FIG. 7 is a cross-sectional view of still another exemplary embodiment of a display apparatus. A display apparatus DD-1 of an exemplary embodiment may further include an input sensing unit TSU between a display panel DP and a window member WP. Referring to FIG. 7, the input sensing unit TSU may be disposed on a display panel DP. The display apparatus DD-1 of an exemplary embodiment may include a thermally releasable adhesive member AP disposed between an input sensing unit TSU and a window member WP, and a thermally releasable adhesive member AP-1 disposed between the display panel DP and the input sensing unit TSU. In an exemplary embodiment, the thermally releasable adhesive members AP and AP-1 may include a base resin BR and microcapsules MC dispersed in the base resin BR. The microcapsule has a shell part and a hollow part, and may include an organic solvent having a vaporization temperature of about 50° C. to about 150° C. in the hollow part.

If heat of a temperature higher than the vaporization temperature of the organic solvent is supplied to the display apparatus DD-1, the adhesive force of the thermally releasable adhesive members AP and AP-1 may decrease, and the detachment of the thermally releasable adhesive members AP and AP-1 may be easily attained. The thermally releasable adhesive member AP disposed between the input sensing unit TSU and the window member WP, and the thermally releasable adhesive member AP-1 disposed between the display panel DP and the input sensing unit TSU may be adhesive members having the same or different adhesion properties.

A case where the thermally releasable adhesive member AP-1 is disposed between the input sensing unit TSU and the display panel DP is illustrated in FIG. 7. However, in another exemplary embodiment, the input sensing unit TSU may be disposed directly on the display panel DP. That is, the input sensing unit TSU may be disposed directly on the display panel DP without disposing a separate adhesive member between the input sensing unit TSU and the display panel DP. In other words, the thermally releasable adhesive member AP-1 disposed between the input sensing unit TSU and the display panel DP may be omitted.

In another exemplary embodiment, one of the thermally releasable adhesive member AP disposed between the input sensing unit TSU and the window member WP, and the thermally releasable adhesive member AP-1 disposed between the display panel DP and the input sensing unit TSU may be an optically clear adhesive member.

The thermally releasable adhesive member of an exemplary embodiment may include microcapsules having a nano scale particle size, and may have good optical properties and decreased adhesive force by leaking out the organic solvent from the microcapsule at high temperature environment, thereby attaining reworkability of the window member WP or the display panel DP.

In addition, the display apparatus of an exemplary embodiment includes a thermally releasable adhesive member, and the adhesive member may be easily detached by supplying heat, thereby improving reworkability and productivity during manufacturing a display apparatus.

Hereinafter, referring to examples and comparative examples, a method for preparing a thermally releasable adhesive member of an exemplary embodiment of the inventive concept and the evaluation of the properties thereof will be explained in particular. In addition, the following examples are only illustrations to assist the understanding of the inventive concept, and the scope of the inventive concept is not limited thereto.

EXAMPLES

1. Method of Preparing Microcapsules

A method for preparing microcapsules included in a thermally releasable adhesive member of an exemplary embodiment of the inventive concept will be explained in detail. In addition, the method for preparing microcapsules explained below is only an exemplary embodiment, and a method for preparing microcapsules of the inventive concept is not limited thereto. For example, the method for preparing microcapsules of an exemplary embodiment is not limited to the suggested reaction conditions, but any conditions known in the technical art may be applied without limitation.

(1) Method for Preparing Microcapsules Including Shell Part Formed Using Homopolymer To 30 g of deionized water ("D.I water"), 0.3 g of sodium dodecyl sulfate ("SDS") was added and mixed by sufficiently stirring. To 2 g of methylcyclohexane as an organic solvent, 0.5 g of methylmethacrylate and 0.0025 g of azo-bisisobutyronitrile ("AIBN") were added, and the organic mixture thus obtained was sufficiently stirred. After that, the stirred organic mixture was added to the D. I water mixed with sodium dodecyl sulfate, followed by stirring at about 40° C. in about 600 rpm for about 30 minutes. Then, an ultrasonic treatment was conducted in an ice water bath using a sonifier with about 70% amplitude for about 3 minutes. After that, the reaction was conducted with a condenser under nitrogen purging at about 70° C. in about 600 rpm for about 8 hours to prepare nanocapsules. Finally, the nanocapsules thus synthesized were separated for 7 days using a dialysis tube. The nanocapsules thus prepared had a particle size of about 50 nm to about 500 nm. The microcapsules thus prepared included a shell part formed of or including PMMA and a hollow part, surrounded by the shell part, including methylcyclohexane.

(2) Method for Preparing Microcapsules Including Shell Part Formed Using Copolymer To 45 g of D.I water, 0.45 g of SDS was added and mixed by sufficiently stirring. To 3 g of methylcyclohexane as an organic solvent, 0.075 g of methylmethacrylate, 0.675 g of acrylonitrile and 0.0038 g of AIBN were added, and the thus obtained organic mixture was sufficiently stirred. After that, the stirred organic mixture was added to the D. I water mixed with sodium dodecyl sulfate, followed by stirring at about 40° C. in about 600 rpm for about 30 minutes. Then, an ultrasonic treatment was conducted in an ice water bath using a sonifier with about 70% amplitude for about 3 minutes. After that, the reaction was conducted with a condenser under nitrogen purging at about 70° C. in about 600 rpm for about 8 hours to prepare nanocapsules. Finally, the nanocapsules thus synthesized were separated for 7 days using a dialysis tube. The nanocapsules have a particle size of about 50 nm to about 500 nm. The microcapsules thus prepared included a shell part formed using a copolymer of PAN and PMMA and a hollow part, surrounded by the shell part, including methylcyclohexane.

2. Method of Preparing Thermally Releasable Adhesive Member

To a PMMA resin as a base resin, the microcapsules thus manufactured were added and stirred for about 30 minutes to produce an adhesive resin for a thermally releasable adhesive member. Two examples having about 1.0 wt % and about 5.0 wt % of the microcapsules, respectively, based on the total amount of the base resin and the microcapsules are used.

Table 1 below illustrates the configuration of the shell part and the organic solvent, and the amount of the microcapsules with respect to the base resin. In Table 1, the amount of the microcapsules corresponds to an amount ratio with respect to 100 of the total amount of the base resin and the microcapsules.

TABLE 1

| Division | Configuration of microcapsule | | Amount of microcapsule |
|---|---|---|---|
| | Shell part | Organic solvent | |
| Example 1-1 | PMMA homopolymer | Methylcyclohexane | 1.0 wt % |
| Example 1-2 | PMMA homopolymer | Methylcyclohexane | 5.0 wt % |
| Example 2-1 | PAN-PMMA copolymer | Methylcyclohexane | 1.0 wt % |

TABLE 1-continued

| Division | Configuration of microcapsule | | Amount of microcapsule |
|---|---|---|---|
| | Shell part | Organic solvent | |
| Example 2-2 | PAN-PMMA copolymer | Methylcyclohexane | 5.0 wt % |

Figure 8:
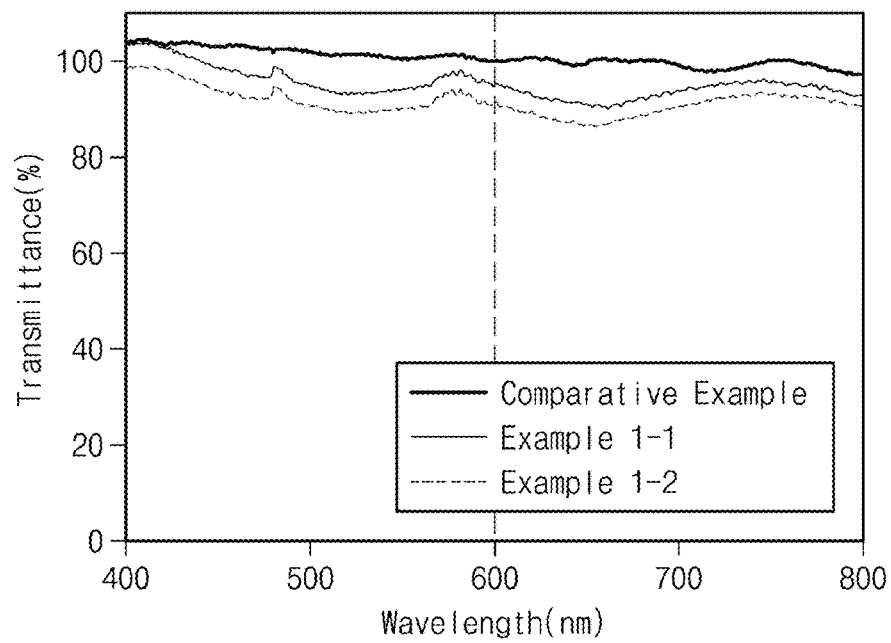
FIGS. 8 and 9 are diagrams illustrating optical transmittance of thermally releasable adhesive members of exemplary embodiments.
Figure 9:
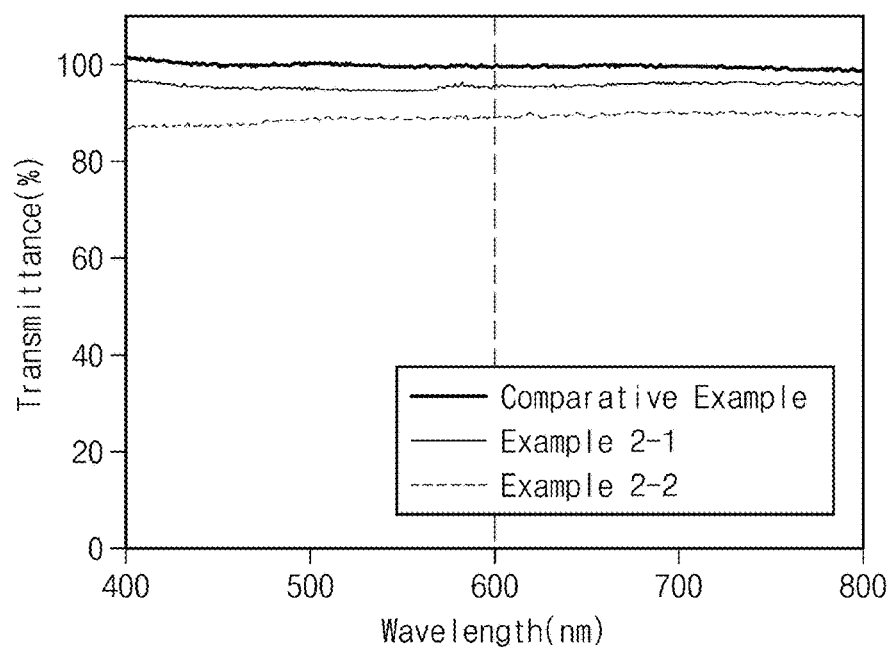

3. Evaluation of Thermally Releasable Adhesive Member (1) Evaluation of Optical Transmittance Optical transmittance was measured for the examples and the comparative example using a UV-Vis spectrometer. Table 2 illustrates the relative values of optical transmittance at about 600 nm for the examples and the comparative example. In addition, FIGS. 8 and 9 illustrate the evaluation results of optical transmittance in the comparative example and the examples. The optical transmittance value shown in Table 2 is relative optical transmittance when the optical transmittance of the comparative example at the wavelength of about 600 nm is 100%.

The evaluation specimens of the comparative example and the examples were obtained by supplying an adhesive member with an uncured state between a cover glass and a polarizer and irradiating ultraviolet rays to form an adhesive layer with a thickness of about 100 micrometers (μm). The comparative example corresponds to an OCA adhesive layer not including microcapsules, and the examples have the configuration of Table 1.

Table 2 illustrates optical transmittance in a wavelength of about 600 nm, and FIGS. 8 and 9 illustrate optical transmittance evaluation results for the comparative example and the examples in a wavelength region of about 400 nm to about 800 nm.

TABLE 2

| Division | Optical transmittance (%) |
|---|---|
| Comparative Example | 100 |
| Example 1-1 | 95 |
| Example 1-2 | 91 |
| Example 2-1 | 96 |
| Example 2-2 | 90 |

Referring to Table 2, and FIGS. 8 and 9, optical transmittance of the thermally releasable adhesive members of the examples including the microcapsules tends to decrease compared to that of the comparative example not including microcapsules. However, it was secured that the examples showed high optical transmittance of about 90% or more in the wavelength of about 600 nm. Particularly, Examples 1-1 and 2-1, in which the amount of the microcapsules was about 1.0 wt %, were secured to show high optical transmittance of about 95% or more in a wavelength of about 600 nm.

(2) Evaluation of Adhesive Force of Thermally Releasable Adhesive Member

The initial adhesion strength and adhesion strength after heat treatment for the comparative example and the examples were evaluated. The comparative example corresponds to an OCA adhesive layer not including microcapsules, and the examples include the microcapsules of the configuration in Table 1.

Table 3 illustrates the relative values of the initial adhesion strength and the adhesion strength after heat treatment for the comparative example and the examples.

TABLE 3

| Division | Initial adhesion strength (%) | Adhesion strength after heat treatment |
|---|---|---|
| Comparative Example | 100 | 100 |
| Example 1-1 | 85 | 12 |
| Example 1-2 | 89 | 11 |
| Example 2-1 | 98 | 15 |
| Example 2-2 | 134 | 6 |

In Table 3, the initial adhesion strength represents relative adhesive force of the examples with respect to the initial adhesion strength of the comparative example before supplying heat of which value was set as 100. In addition, the adhesive strength after heat treatment illustrates the relative adhesive force of the examples with respect to the adhesive strength of the comparative example after heat treatment at about 100° C. of which value was set as 100.

Referring to Table 3, regarding the initial adhesion strength, the adhesion strengths of Example 1-1 and Example 1-2 have values somewhat reduced compared to that of Comparative Example, and Example 2-1 and Example 2-2 showed similar degree or somewhat higher adhesion strength than that of Comparative Example.

However, the adhesion strength of the examples after heat treatment decreases to about 15% or less with respect to that of Comparative Example.

That is, it may be found that the thermally releasable adhesive member of the Example shows relatively good adhesive force (i.e., 85% to 134%) with respect to that of the OCA adhesive layer of Comparative Example not including microcapsules, and may be easily removed by supplying heat to decrease adhesive force when detachment is required.

The thermally releasable adhesive member of an exemplary embodiment includes microcapsules having a nano scale particle size, and includes an organic solvent in the microcapsule, thereby having high optical transmittance and a low haze value, and being easily detached in high temperature conditions. In addition, the thermally releasable adhesive member of an exemplary embodiment may be diversely used in a case requiring optical clearness and reworkability, because of good optical properties and adhesive force decreasing by the application of heat.

In addition, since the display apparatus of an exemplary embodiment includes the thermally releasable adhesive member, reworkability during manufacturing process may be improved. Particularly, the thermally releasable adhesive member may be easily removed without damaging other members of the display apparatus by decreasing the adhesive force of the thermally releasable adhesive member by increasing the volume of a microcapsule by vaporizing an organic solvent in the microcapsule, or by eluting the organic solvent in the microcapsule, thereby improving the productivity of the display apparatus.

The thermally releasable adhesive member of an exemplary embodiment includes microcapsules containing an organic solvent and may attain an adhesive member of which adhesive force is deteriorated at a high temperature, and reworkability of a display apparatus may be improved by using the adhesive member in the display apparatus.

The thermally releasable adhesive member of an exemplary embodiment may have a nano scale particle size and include microcapsules having a shell part formed or including a hydrophobic polymer, thereby providing excellent optical properties of optical transmittance and improved thermal release properties.

Although the exemplary embodiments of the invention have been described, it is understood that the invention should not be limited to these exemplary embodiments but various changes and modifications can be made by one ordinary skilled in the art within the spirit and scope of the invention as hereinafter claimed.

What is claimed is:

1. A display apparatus comprising:
a display panel;
a window member disposed on the display panel; and
a thermally releasable adhesive member disposed between the display panel and the window member,
wherein the thermally releasable adhesive member comprises:
a base resin and
microcapsules dispersed in the base resin,
wherein at least one of the microcapsules comprises:
a shell part which comprises a hydrophobic polymer material; and
a hollow part which is defined by the shell part and contains an organic solvent,
wherein the hydrophobic polymer material comprises a copolymer of polyacrylonitrile and polymethylmethacrylate.

2. The display apparatus of claim 1, further comprising an optically clear adhesive member which comprises the base resin without the microcapsules,
wherein the optically clear adhesive member is disposed between the display panel and the thermally releasable adhesive member, or between the window member and the thermally releasable adhesive member.

3. The display apparatus of claim 1, wherein the hydrophobic polymer material has solubility in water of 1.0 or less at room temperature.

4. The display apparatus of claim 1, wherein the hydrophobic polymer material comprises any one of polymethylmethacrylate, polymethylacrylate, polystyrene, polyvinyl acetate, polyvinyl benzoate, polyacrylonitrile, and polymethacrylonitrile, or a copolymer formed of or including a combination thereof.

5. The display apparatus of claim 1, wherein a vaporization temperature of the organic solvent is from 50° C. to 150° C.

6. The display apparatus of claim 1, wherein the organic solvent has solubility in water of 1.0 or less at room temperature.

7. The display apparatus of claim 1, wherein the organic solvent comprises at least one of methylcyclohexane, cyclohexane, cyclopentane, isooctane, tert-butylacetate, heptene, and heptane.

8. The display apparatus of claim 5, wherein the at least one of the microcapsules has a first volume at room temperature and a second volume greater than the first volume at the vaporization temperature or higher.

9. The display apparatus of claim 5, wherein the thermally releasable adhesive member has a first adhesive force at room temperature and a second adhesive force at the vaporization temperature, and
the second adhesive force is equal to or less than 90 percentages (%) of the first adhesive force.

10. The display apparatus of claim 1, wherein an optical transmittance of the thermally releasable adhesive member in a wavelength region of 400 nanometers to 800 nanometers is 90% or more, and
wherein a haze value of the thermally releasable adhesive member is 0.1% or less.

11. The display apparatus of claim 1, wherein an amount ratio of the microcapsules dispersed in the base resin is from 0.05 weight percentages (wt %) to 40 wt % of a total amount of the base resin and the microcapsules.

12. A display apparatus comprising:
a display panel;
a window member disposed on the display panel; and
a thermally releasable adhesive member disposed between the display panel and the window member,
wherein the thermally releasable adhesive member comprises:
a base resin and
microcapsules dispersed in the base resin,
wherein at least one of the microcapsules comprises:
a shell part which comprises a hydrophobic polymer material; and
a hollow part which is defined by the shell part and contains an organic solvent,
wherein the thermally releasable adhesive member is a double-sided adhesive sheet which comprises a first side and a second side opposite to the first side, and
a dispersion density of the microcapsules decreases from the first side to the second side.

13. A display apparatus comprising:
a display panel;
a window member disposed on the display panel; and
a thermally releasable adhesive member disposed between the display panel and the window member,
wherein the thermally releasable adhesive member comprises:
a base resin and
microcapsules dispersed in the base resin,
wherein at least one of the microcapsules comprises:
a shell part which comprises a hydrophobic polymer material; and
a hollow part which is defined by the shell part and contains an organic solvent,
wherein the thermally releasable adhesive member comprises:
a first adhesive part in which the microcapsules are dispersed with a first density;
a second adhesive part in which the microcapsules are dispersed with a second density; and
a third adhesive part disposed between the first adhesive part and the second adhesive part, microcapsules in the third adhesive part being dispersed with a third density,
wherein the third density is smaller than or equal to a lower density of the first density and the second density.

14. The display apparatus of claim 1, wherein the base resin comprises at least one of an acrylate-based resin, a silicone-based resin, an urethane-based resin, an epoxy-based resin, a rubber-based resin, and a polyester-based resin.

15. The display apparatus of claim 1, wherein a particle size of the at least one of the microcapsules is from 50 nanometers to 450 nanometers.

* * * * *